US006756848B2

United States Patent
Garcia et al.

(10) Patent No.: US 6,756,848 B2
(45) Date of Patent: Jun. 29, 2004

(54) AMPLIFIER DEVICE WITH GAIN SWITCHING, FOR A CELLULAR MOBILE TELEPHONE IN PARTICULAR

(75) Inventors: Patrice Garcia, Saint Martin d'Heres (FR); Didier Belot, Rives (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/106,875

(22) Filed: Mar. 26, 2002

(65) Prior Publication Data

US 2002/0140510 A1 Oct. 3, 2002

(30) Foreign Application Priority Data

Mar. 27, 2001 (FR) .......................................... 01 04102

(51) Int. Cl.[7] .............................................. H03G 3/10
(52) U.S. Cl. ...................................... 330/278; 330/300
(58) Field of Search ............................... 330/278, 284, 330/300

(56) References Cited

U.S. PATENT DOCUMENTS

| 3,538,448 A | * | 11/1970 | Harford ........................ 330/29 |
| 4,464,635 A | * | 8/1984 | Rypkema .................... 330/284 |
| 4,785,259 A | * | 11/1988 | Seelbach et al. ............ 330/300 |
| 6,023,192 A | | 2/2000 | Didier ......................... 330/254 |
| 6,211,737 B1 | * | 4/2001 | Fong ........................... 330/282 |

OTHER PUBLICATIONS

Moroney et al., A High Performance Switched–LNA IC for CDMA Handset Receiver Applications, Radio Frequency Integrated Circuits (RFIC) Symposium, 1998 IEEE Baltimore, MD, Jun. 7–9, 1998, New York, pp. 43–46.
Patent Abstracts of Japan, vol. 1999, No. 08, Jun. 30, 1999 & JP 11088082A (Sony Corp.), Mar. 30, 1999.

\* cited by examiner

*Primary Examiner*—Henry Choe
(74) *Attorney, Agent, or Firm*—Lisa K. Jorgenson; Allen, Dyer, Doppelt, Milbrath & Gilchrist, P.A.

(57) ABSTRACT

An amplifier device with gain switching includes an amplifier, and a configurable load circuit including an inductive element. The configurable load circuit is capable of exhibiting two configurations having two different impedance values. A controllable switch is connected between the amplifier and the load circuit to select one of the two configurations of the load circuit. The load circuit includes two insulated-gate field effect load transistors connected in series, and which operate in a triode mode. The inductive element is connected in parallel with the pair of load transistors, and between a power supply terminal and the switching circuit.

26 Claims, 2 Drawing Sheets

AMPLIFIER DEVICE WITH GAIN SWITCHING, FOR A CELLULAR MOBILE TELEPHONE IN PARTICULAR

FIELD OF THE INVENTION

The present invention relates to amplifier devices, and more particularly, to a low noise amplifier device (LNA) with gain switching. The invention applies especially, but not exclusively, for use in a receiver front end that receives radio frequency signals, such as those intended for mobile telephony circuits.

BACKGROUND OF THE INVENTION

Low noise input amplifiers of a radio frequency receiving system generally make use of gain switching for reducing the dynamic range constraints imposed on the first frequency conversion stage. Such an amplifier generally operates according to two modes, a high gain mode and a low gain mode.

In the high gain mode, the gain of the amplifier, in terms of power, has to be sufficient, and is typically greater than 15 dB. However, in the presence of signals having stronger power, the gain of the amplifier is cut and the low gain operating mode is entered, in which the gain is typically on the order of −5 dB.

To keep the matching of the amplifier constant in the two gain modes, in terms of power, a structure is generally used of the type comprising amplification means. The amplification means generally includes a bipolar transistor which constitutes the heart of the amplifier, and a configurable load circuit. The configurable load circuit includes an inductive element and two resistive elements, and is capable of exhibiting two different configurations respectively having two different impedance values.

A controllable switching means is connected between the amplification means and the load circuit to select one of the two configurations of the load circuit. This switching means is generally formed by two bipolar transistors, one of which is connected to the common terminal of the two resistive elements and the other of which is connected to the common terminal between one of the resistive elements and the inductive element.

The selection between the high gain mode and the low gain mode takes place by turning off one of the two transistors of the switching means while the other one is kept turned on. In the high gain mode, the power gain is a function (to a first approximation) of the bias current of the transistor of the amplification means, of the degeneracy inductor connected to the emitter of the transistor, and of the losses of the matching networks present at the input and at the output of the amplifier.

However, the power gain is limited by the value of the resistor connected between the two switching transistors, and therefore, the value has to be sufficiently high. In the low gain mode, the power gain is fixed by the ratio of the two resistors which has to be on the order of 1/10 to obtain an attenuation of −5 dB, which corresponds to about 20 dB less than in the high gain mode.

In wireless communications systems of the type operating according to the wideband CDMA (WCDMA) standard, which is well known to the person skilled in the art, a relatively high gain is specified to be obtained in the high gain mode, and is typically a gain on the order of 16 dB. However, with regards to the resistance values used, the maximum gain available for the amplifier reaches this value only with difficulty.

Furthermore, in the low gain mode, the value of the other resistor, which has to be ten times less than that of the abovementioned resistor, is at the origin of an internal overvoltage on the collector of one of the two switching transistors. The compression point is therefore limited by the dynamic range of the signal while the amplifier is operating in an attenuator mode. In conclusion, in conventional amplification devices, the choice of the values of the resistive elements of the load circuit results from a compromise between the gain in the high gain mode and the compression point in the low gain mode.

SUMMARY OF THE INVENTION

In view of the foregoing background, an object of the invention is to optimize the output dynamic range in the low gain mode while maintaining a high gain in the high gain mode.

This and other objects, advantages and features according to the invention are provided by an amplifier device with gain switching, and comprises amplification means and a configurable load circuit. The configurable load circuit includes an inductive element that is capable of exhibiting two different configurations having two different impedance values. Controllable switching means is connected between the amplification means and the load circuit to select one of the two configurations.

According to one general characteristic of the invention, the load circuit includes two insulated-gate field effect load transistors connected in series and operate in the triode mode. The inductive element is connected in parallel with the pair of load transistors between a power supply terminal and the switching circuit.

The operation of the load transistors in the triode mode, that is, control via the gate voltage of the flow of the current between the source and the drain, makes it possible to turn these load transistors off or on depending on the gain desired. More precisely, when the load transistors are turned off, they operate like a capacitive network leading to maximum gain, while, when they are turned on, they operate like resistors making it possible to lower the gain. In the high gain mode, that is, when the transistors are turned off, they do not introduce any resistive loss.

According to one embodiment of the invention, the two load transistors are both controllable on the gate by the same control signal (gate voltage). A first terminal of the inductive element is connected to the power supply terminal, and the second terminal of the inductive element is connected to a first switching input of the switching means. The common terminal of the two load transistors is connected to a second switching input of the switching means. The device also includes selection means for delivering a selection signal to the switching means for selecting the configuration, and to deliver the control signal in such a way as to turn the two transistors off or on depending on the configuration selected.

According to one embodiment of the invention, the switching means includes a first switching transistor connected between the amplification means and the first switching input, and a second switching transistor connected between the amplification means and the second switching input. In a first configuration of the load circuit (corresponding to the high gain mode, for example), the load transistors are turned off, the first switching transistor is turned on and the second switching transistor is turned off.

In a second configuration of the load circuit (corresponding to the low gain mode, for example), the load transistors are turned on, the first switching transistor is turned off and the second switching transistor is turned on. In the low gain mode, that is, in the second configuration, the load transistor connected between the two switching inputs has to exhibit the highest resistance.

As a result, this load transistor features a channel width which is less than that of the other load transistor, which has to exhibit a much lower resistance. This is particularly advantageous, since the smaller transistor which is connected between the collector of the second switching transistor and the inductive element exhibits a low value of stray capacitance which is much easier to handle than a capacitance having a larger value.

Although it would be possible to use NMOS transistors as load transistors, load transistors of the PMOS type will preferably be used, which makes it possible to control them on their gate via a positive control voltage. Furthermore, to avoid the PMOS transistors from becoming turned on accidentally in the high gain mode in the presence of a strong output signal, a value at least equal to that of the power supply voltage increased by the threshold voltage of the drain-substrate diode of a load transistor will advantageously be chosen for the control voltage.

Another aspect of the invention is directed to a radio frequency receiver, for example, a cellular mobile telephone incorporating an amplifier device according to the invention.

BRIEF DESCRIPTION OF THE DRAWINGS

Other advantages and characteristics of the invention will emerge on examining the detailed description of an embodiment which is not in any way limiting, and of the attached drawings, in which.

DETAILED DESCRIPTION OF THE PREFERRED EMBODIMENTS

Figure 1:
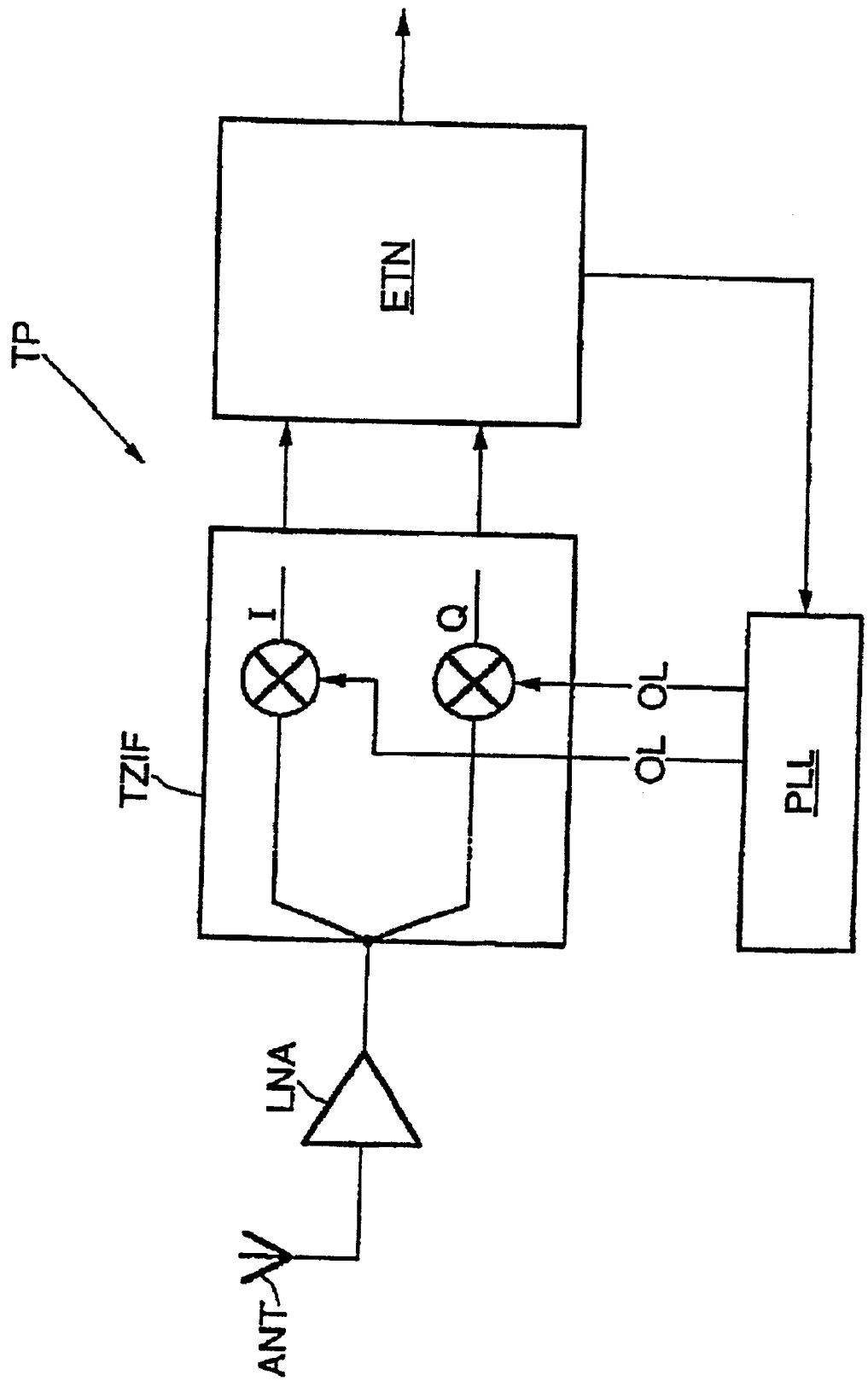
FIG. 1 diagrammatically and partially illustrates a cellular mobile telephone, and particularly the receiving front end incorporating a low noise amplifier device according to the invention.

In FIG. 1, the reference TP designates a cellular mobile telephone. The radio frequency receiving front end receives a radio frequency signal (RF) which originates from a receiving antenna ANT by passing, if appropriate, through an antenna coupler and/or an isolation transformer (not represented).

The RF signal is sent to a low noise amplifier LNA. The output of the amplifier LNA is connected to a tuner TZIF of conventional structure which is known to those skilled in the art. This tuner TZIF thus includes, especially on its two processing channels, band-pass filters, controlled-gain amplifiers, and two mixers receiving, respectively from a phase-lock loop, two local oscillator signals OL mutually phase shifted by 90°. This defines a reference channel (in phase), i.e., the I channel, and a quadrature channel, i.e., the Q channel.

The frequency of the local oscillator signals OL defines the nominal frequency of the reception frequency band selected by the portable telephone. The tuner TZIF is coupled, by way of an analog/digital conversion stage, to a digital processing stage, implemented in hardware partly by hard-wired logic and partly by a signal processor.

The structure and the functions of such a stage ETN are also well known to the person skilled in the art. More precisely, in terms of functionally, the processing stage (in addition to means for estimating the pulse response of the transmission channel) includes means for suppressing inter-symbol interference (equalizer) and a channel-decoding unit. The processing stage also includes modulation/demodulation means capable of carrying out the demodulation of the received signal, and the modulation of the signal to be transmitted via a transmission system. The transmitter is not represented in FIG. 1 for the sake of simplification.

Furthermore, as is conventional in portable telephones, automatic frequency control means, after demodulation of a pilot signal, deliver a control word to the phase lock loop PLL (for example, to a voltage-controlled temperature stable oscillator VCTXO) serving as a reference for the PLL loop), so as to control the accuracy of the local oscillator OL signals.

The low noise amplifier LNA is a gain switching amplifier of which one example embodiment will now be described, with a single input structure, while referring more particularly to FIG. 2. The invention applies equally to an amplifier with a differential structure.

Figure 2:
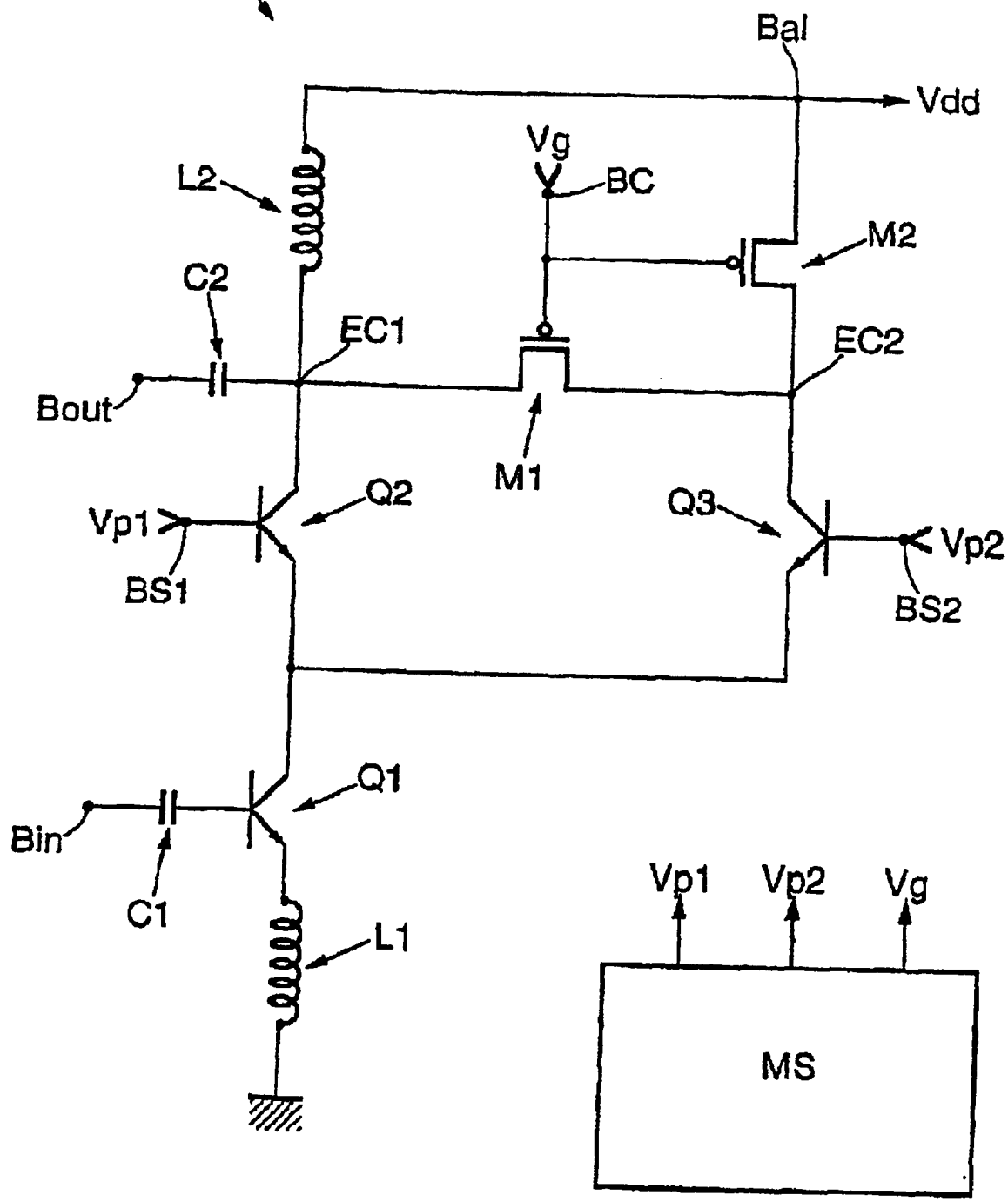
FIG. 2 illustrates, in further detail, an embodiment of the low noise amplifier illustrated in FIG. 1.

In FIG. 2, reference Q1 designates a bipolar transistor forming the amplification means (heart of the amplifier). This transistor Q1 is associated with a capacitive/inductive input matching network. More precisely, an input capacitor C1 is connected between the base of the transistor Q1 and the input terminal Bin of the amplifier LNA. An inductive element L1 is connected between the emitter of the transistor Q1 and ground.

A current-switching circuit is connected to the collector of the transistor Q1. This switching circuit is formed essentially from two bipolar switching transistors Q2 and Q3. More precisely, the emitter of the first switching transistor Q2 is connected to the collector of the transistor Q1. The base of the transistor Q2 is linked to a first selection terminal BS1 able to receive a selection voltage Vp1. The collector of the transistor Q2 forms a first switching input EC1 for the switching circuit.

The collector of the second switching transistor Q3 forms a second switching input EC2. The emitter of this transistor Q3 is linked to the collector of the transistor Q1, and the base of the transistor Q3 is linked to a second selection terminal BS2 intended to receive a second selection voltage Vp2.

A load circuit is connected, furthermore, between a power supply terminal Bal of the amplifier (supplied at the power supply voltage Vdd) and the two switching inputs EC1 and EC2 of the switching circuit. More precisely, the load circuit includes a first load transistor M1 and a second load transistor M2, which are connected in series between the first switching input EC1 and the power supply terminal Bal.

These two load transistors M1, M2 are PMOS transistors, the two respective gates of which are linked together to a control terminal BC capable of receiving a control voltage Vg. The common terminal of the two transistors M1 and M2 is linked to the second switching input EC2.

Furthermore, an inductive element L2 is connected in parallel at the terminals of the pair of load transistors M1 and M2 between the first switching input EC1 and the power supply terminal Bal. This inductive element L2 furthermore forms an output-matching network, with a capacitor C2 connected between the first switching input EC1 and an output terminal Bout of the amplifier.

The amplifier LNA furthermore includes selection means MS which are intended to deliver the various voltages Vp1, Vp2 and Vg. These means MS may be conventionally implemented on the basis of a voltage source and switching logic elements, for example.

In a first configuration of the load circuit, corresponding to the high gain mode, the selection voltages (base voltage) Vp1 and Vp2 of the transistors Q2 and Q3 are held around 1.8 volt and 1.1 volt respectively, for example, so as to have the first switching transistor Q2 turned on and the second switching transistor Q3 turned off.

Furthermore, the gate voltage Vg is taken to a value at least equal to the power supply voltage Vdd increased by the threshold voltage of the drain-substrate diode of each load transistor. Thus, by way of example, if the power supply voltage Vdd is on the order of 2.7 volts, a voltage Vg will be chosen at least equal to 3.3 volts. This makes it possible to keep a gate-source voltage Vgs for each load transistor which is sufficiently high, even in the presence of strong output signals. This is done to avoid the transistors M1 and M2, which are turned off, from accidentally becoming turned on.

In this configuration, the load transistors M1 and M2, which are turned off, operate like two capacitors connected in parallel with the inductive element L2. There are no resistive losses, and consequently, no limitation on the gain on such resistive losses.

Furthermore, the input impedance of the load transistor M1 is then sufficiently high so as not to degrade the gain. The maximum gain available may be on the order of 20 dB at 2 GHz, for example, which represents an improvement with respect to a conventional layout using resistive elements. The person skilled in the art will be able to choose the surface area of the load transistors M1 and M2 in such a way as to determine their capacitive value, thus making it possible to set up correctly to the frequency of the signal to be amplified.

In the second configuration of the load circuit, the voltages Vp1 and Vp2 are held around 1.1 volt and 1.8 volt respectively, for example, so as, this time, to make the first switching transistor Q2 turned off and the second switching transistor Q3 turned on.

Furthermore, in this second configuration, the gate voltage Vg is held, for example, at 0 volt, which makes the transistors M1 and M2 conduct. These transistors, biased into the resistive region, then operate like low value resistors which makes it possible to obtain a gain on the order of −3 dB, for example. The minimum power gain is set by the ratio of the resistance values of the transistors M1 and M2, that is by the ratio of the channel widths W1 and W2. The person skilled in the art will also be able to adjust the dimensions of the load transistors M1 and M2 to obtain the minimum gain desired.

Furthermore, it should be noted that the resistive value of the transistor M1 should be much higher than the resistive value of the transistor M2. Consequently, the transistor M1 should feature a much smaller surface area than the surface area of the transistor M2, which advantageously leads to a lower stray capacitance being obtained during operation in low-gain mode.

The invention thus makes it possible to choose lower resistance values in the low gain mode, which makes it possible to optimize the output dynamic range, while keeping a high gain in the high gain mode.

That which is claimed is:

1. An amplifier device with gain switching comprising:
   an amplifier;
   a configurable load circuit having different configurations, with each configuration having a different impedance; and
   a switching circuit connected between said amplifier and said configurable load circuit for selecting one of the configurations thereof;
   said configurable load circuit comprising
      a pair of insulated-gate field effect load transistors connected in series and operating in a triode mode, and
      an inductive element connected in parallel to said pair of load transistors, and connected between a power supply terminal and said switching circuit.

2. An amplifier device according to claim 1, wherein each load transistor comprises a gate for receiving a control signal that is the same for each load transistor; and wherein said switching circuit includes a first switching input connected to said inductive element and a second switching input connected to a common terminal of said pair of load transistors.

3. An amplifier device according to claim 1, further comprising:
   a selection circuit for delivering at least one selection signal to said switching circuit for selecting one of the two configurations of said configurable load circuit, and for delivering the control signal for turning said pair of load transistors off or on based upon the configuration selected.

4. An amplifier device according to claim 2, wherein said switching circuit comprises:
   a first switching transistor connected between said amplifier and the first switching input;
   a second switching transistor connected between said amplifier and the second switching input; and
   in a first configuration of said configurable load circuit said pair of load transistors are turned off, and said first switching transistor is turned on and said second switching transistor is turned off;
   in a second configuration of said configurable load circuit said pair of load transistors are turned on, and said first switching transistor is turned off and said second switching transistor is turned on.

5. An amplifier device according to claim 2, wherein each load transistor comprises a source and a drain with a channel defined therebetween, and one of said pair of load transistors is connected between the power supply terminal and the second switching input, and a width of the channel of this load transistor is greater than a width of the channel of the other load transistor.

6. An amplifier device according to claim 1, wherein the power supply terminal is for receiving a power supply voltage; and wherein each load transistor comprises a PMOS transistor comprising a gate for receiving a control voltage and a source, with the control, voltage having a value that is at least equal to the power supply voltage increased by a threshold voltage of a gate-source voltage for each load transistor.

7. An amplifier device with gain switching comprising:
   an amplifier;
   a configurable load circuit having different configurations, with each configuration having a different impedance; and
   a switching circuit connected between said amplifier and said configurable load circuit for selecting one of the configurations thereof;
   said configurable load circuit comprising
      a pair of load transistors connected in series, and
      an inductive element connected in parallel to said pair of load transistors, and directly connected between a power supply terminal and said switching circuit.

8. An amplifier device according to claim 7, wherein said pair of load transistors operate in a triode mode.

9. An amplifier device according to claim 7, wherein each load transistor comprises a control terminal for receiving a control signal that is the same for each load transistor; and wherein said switching circuit includes a first switching input connected to said inductive element and a second switching input connected to a common terminal of said pair of load transistors.

10. An amplifier device according to claim 7, further comprising:
a selection circuit for delivering at least one selection signal to said switching circuit for selecting a configuration of said configurable load circuit, and for delivering the control signal for turning said pair of load transistors off or on based upon the configuration selected.

11. An amplifier device according to claim 9, wherein said switching circuit comprises:
a first switching transistor connected between said amplifier and the first switching input;
a second switching transistor connected between said amplifier and the second switching input; and
in a first configuration of said configurable load circuit said pair of load transistors are turned off, and said first switching transistor is turned on and said second switching transistor is turned off;
in a second configuration of said configurable load circuit said pair of load transistors are turned on, and said first switching transistor is turned off and said second switching transistor is turned on.

12. An amplifier device according to claim 9, wherein each load transistor comprises first and second conduction terminals with a channel defined therebetween, and one of said pair of load transistors is connected between the power supply terminal and the second switching input, and a width of the channel of this load transistor is greater than a width of the channel of the other load transistor.

13. An amplifier device according to claim 7, wherein the power supply terminal is for receiving a power supply voltage; and wherein each load transistor comprises a PMOS transistor comprising a gate for receiving a control voltage and a source, with the control voltage having a value that is at least equal to the power supply voltage increased by a threshold voltage of a gate-source voltage for each load transistor.

14. A receiver comprising:
an amplifier device with gain switching comprising
an amplifier
a configurable load circuit having different configurations, with each configuration having a different impedance, and
a switching circuit connected between said amplifier and said configurable load circuit for selecting one of the configurations of said configurable load circuit, said configurable load circuit comprising
a pair of load transistors connected in series, and
an inductive element connected in parallel to said pair of load transistor, and directly connected between a power supply terminal and said switching circuit; and
a tuner connected to said amplifier device.

15. A receiver according to claim 14, wherein said pair of load transistors comprises a pair of field effect transistors operating in a triode mode.

16. A receiver according to claim 14, wherein each load transistor comprises a control terminal for receiving a control signal that is the same for each load transistor; and wherein said switching circuit includes a first switching input connected to said inductive element and a second switching input connected to a common terminal of said pair of load transistors.

17. A receiver according to claim 14, wherein said amplifier device further comprises:
a selection circuit for delivering at least one selection signal to said switching circuit for selecting one of the configurations of said configurable load circuit, and for delivering the control signal for turning said pair of load transistors off or on based upon the configuration selected.

18. A receiver according to claim 16, wherein said switching circuit comprises:
a first switching transistor connected between said amplifier and the first switching input;
a second switching transistor connected between said amplifier and the second switching input; and
in a first configuration of said configurable load circuit said pair of load transistors are turned off, and said first switching transistor is turned on and said second switching transistor is turned off;
in a second configuration of said configurable load circuit said pair of load transistors are turned on, and said first switching transistor is turned off and said second switching transistor is turned on.

19. A receiver according to claim 16, wherein each load transistor comprises first and second conduction terminals with a channel defined therebetween, and one of said pair of load transistors is connected between the power supply terminal and the second switching input, and a width of the channel of this load transistor is greater than a width of the channel of the other load transistor.

20. A receiver according to claim 14, wherein the power supply terminal is for receiving a power supply voltage; and wherein each load transistor comprises a PMOS transistor comprising a gate for receiving a control voltage and a source, the control voltage having a value that is at least equal to the power supply voltage increased by a threshold voltage of a gate-source voltage for each load transistor.

21. A receiver according to claim 14, wherein said amplifier device and said tuner are part of a cellular mobile telephone.

22. A method for selecting a gain of an amplifier device comprising an amplifier, a configurable load circuit, and a selection circuit connected between the amplifier and the configurable load circuit, the configurable load circuit comprising a pair of load transistors connected in series and operating in a triode mode, and an inductive element connected in parallel to the pair of load transistors and directly connected between a power supply terminal and the switching circuit, the method comprising:
delivering at least one selection signal from the selection circuit to the switching circuit for selecting one of the configurations of the configurable load circuit, with each configuration having a different impedance; and
delivering a control signal for turning the pair of load transistors off or on based upon the configuration selected.

23. A method according to claim 22, wherein each load transistor comprises a control terminal for receiving the control signal that is the same for each load transistor; wherein the switching circuit includes a first switching input connected to the inductive element and a second switching input connected to a common terminal of the pair of load transistors; and wherein delivering the at least one selection signal comprises:

delivering a first selection signal to the first switching input; and delivering a second selection signal to the second switching input.

24. A method according to claim 23, wherein the switching circuit comprises a first switching transistor connected between the amplifier and the first switching input, and a second switching transistor connected between the amplifier and the second switching input; and further comprising:

in a first configuration of the configurable load circuit, turning off the pair of load transistors, and turning on the first switching transistor and turning off the second switching transistor;

in a second configuration of the configurable load circuit, turning on the pair of load transistors, and turning off the first switching transistor and turning on the second switching transistor.

25. A method according to claim 23, wherein each load transistor comprises first and second conduction terminals with a channel defined therebetween, and one of the pair of load transistors is connected between the power supply terminal and the second switching input, and a width of the channel of this load transistor is greater than a width of the channel of the other load transistor.

26. A method according to claim 23, wherein the power supply terminal is for receiving a power supply voltage; and wherein each load transistor comprises a PMOS transistor comprising a gate for receiving a control voltage and a source, the control voltage having a value that is at least equal to the power supply voltage increased by a threshold voltage of a gate-source voltage for each load transistor.

* * * * *

UNITED STATES PATENT AND TRADEMARK OFFICE
CERTIFICATE OF CORRECTION

PATENT NO. : 6,756,848 B2
DATED : June 29, 2004
INVENTOR(S) : Garcia et al.

It is certified that error appears in the above-identified patent and that said Letters Patent is hereby corrected as shown below:

Column 6,
Line 51, delete "control, voltage" insert -- control voltage --

Column 7,
Line 59, delete "transistor" insert -- transistors --

Signed and Sealed this

Twenty-second Day of March, 2005

JON W. DUDAS
*Director of the United States Patent and Trademark Office*